United States Patent [19]

Fisher et al.

[11] Patent Number: 4,904,614
[45] Date of Patent: Feb. 27, 1990

[54] METHOD OF MANUFACTURING LATERAL IGFETS INCLUDING REDUCED SURFACE FIELD REGIONS

[75] Inventors: Carole A. Fisher, Horley; David H. Paxman, Redhill; David J. Coe, East Grinstead, all of England

[73] Assignee: U.S. Philips Corporation, New York, N.Y.

[21] Appl. No.: 197,539

[22] Filed: May 23, 1988

[30] Foreign Application Priority Data

Jun. 8, 1987 [GB] United Kingdom ................ 8713386

[51] Int. Cl.$^4$ .......................................... H01L 21/265
[52] U.S. Cl. ......................................... 437/41; 437/45; 437/63; 437/59; 437/917
[58] Field of Search .................. 437/40, 41, 44, 45, 437/59, 61, 63, 64, 240, 247, 917, 934, 952, 968, 29, 28; 148/DIG. 96; 357/23.8, 52, 53

[56] References Cited

U.S. PATENT DOCUMENTS

| | | | |
|---|---|---|---|
| 4,602,266 | 7/1986 | Coe | 357/20 |
| 4,639,761 | 1/1987 | Singer et al. | 357/234 |
| 4,774,560 | 9/1988 | Coe | 357/52 |

FOREIGN PATENT DOCUMENTS

| | | | |
|---|---|---|---|
| 0069429 | 1/1983 | European Pat. Off. | 357/23.8 |
| 0052272 | 4/1980 | Japan | 357/23.8 |

OTHER PUBLICATIONS

Glogolja, M., et al., "Smart-SIPMOS . . .", *Conference Record 1986 IEEE Industry Appl. Soc. Ann. Meet.*, part I, pp. 429–433.

Appels, J. A., et al., "Thin Layer High Voltage Devices," *Philips J. Res.*, vol. 35, No. 1, 1980, pp. 1–13.

Primary Examiner—Brian E. Hearn
Assistant Examiner—T. N. Quach
Attorney, Agent, or Firm—Paul R. Miller

[57] ABSTRACT

A method of manufacturing a semiconductor device such as a lateral insulated gate field effect transistor is described in which impurities for forming first and second relatively shallow RESURF regions (8 and 11) of the opposite and the one conductivity type, respectively, are then introduced into the first region (4) and the semiconductor body is then heated first in an oxidizing atmosphere to cause the impurities to diffuse to form the RESURF regions (8 and 11) and to grow a relatively thick layer of insulating material on the given surface (3) at the same time. The relatively thick layer of insulating material is then defined to provide field oxide (14a) and gate oxide (14) then grown onto which is deposited a conductive gate layer (15,16) to form an insulated gate structure. Impurities are then introduced into the semiconductor body (3) using the insulated gate structure as a mask so as to form a lateral insulated gate field effect transistor (1).

8 Claims, 3 Drawing Sheets

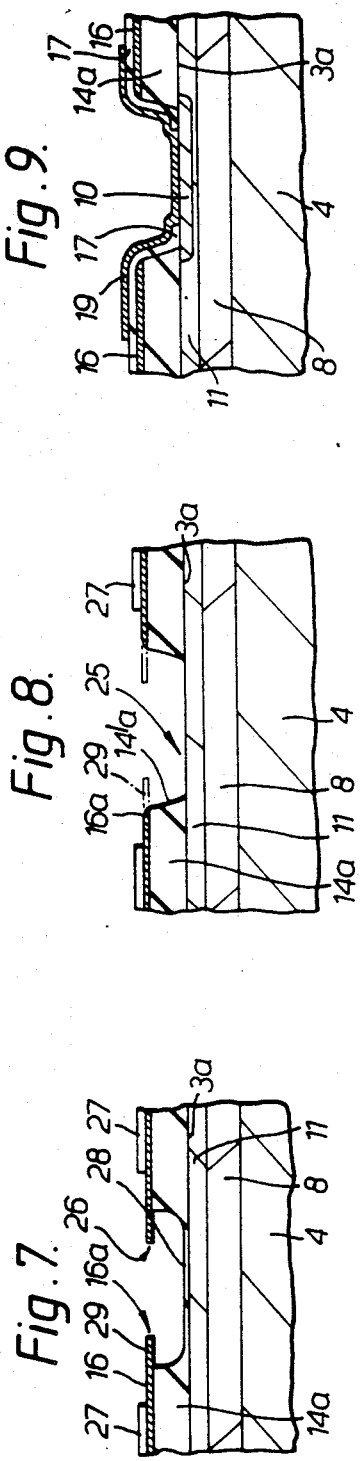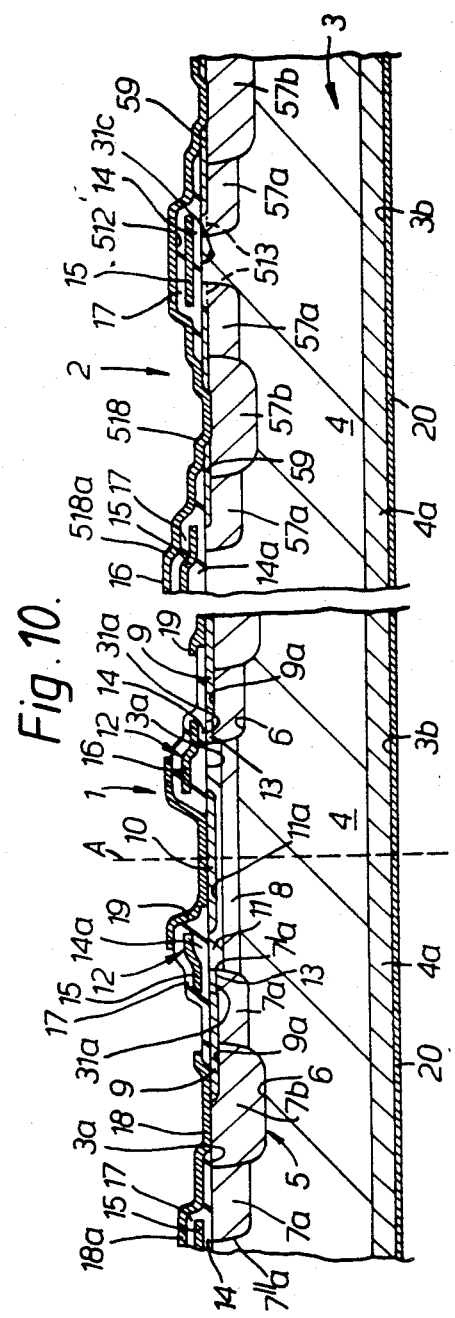

METHOD OF MANUFACTURING LATERAL IGFETS INCLUDING REDUCED SURFACE FIELD REGIONS

BACKGROUND OF THE INVENTION

This invention relates to a method of manufacturing a semiconductor device comprising a lateral insulated gate field effect transistor suitable for use in intelligent power switches.

As used herein the term 'intelligent power switch' is to be understood as meaning a semiconductor device in which one or more power semiconductor components are provided in or on the same semiconductor body as logic components for controlling and monitoring operation of the power semiconductor component and a load in circuit with the switch. Such an intelligent power switch may, for example, be used to control lights, electric motors, etc. Thus, for example, in combination with a simple bus system and central control unit such intelligent power switches may be used to replace the wiring loom of a motor vehicle. In such a situation the power supply to the intelligent power switch will be provided by the vehicle's battery.

Such an intelligent power switch is described in a paper entitled "SMART-SIPMOS—an intelligent power switch" by M. Glogolja and Dr. J. Tihanyi published in the Conference Record of the 1986 IEEE Industry Applications Society Annual Meeting part I at pages 429 to 433.

As discussed in the aforementioned paper, such an intelligent power switch includes low voltage complementary MOS or insulated gate field effect transistors (IGFET) and also high voltage IGFETs capable of withstanding voltages of the order of 50 volts.

One way of enabling such lateral IGFETs to withstand relatively high voltages is to provide relatively lowly doped relatively shallow regions or RESURF (REduced SURface Field) regions which become substantially fully depleted of free charge carriers before the reverse biassing of an adjoining pn junction reaches the breakdown voltage of the pn junction and thus serve to spread the depletion region laterally so reducing the surface electrostatic field and increasing the reverse breakdown voltage of the pn junction. Thus, as shown in the aforementioned paper, in the case of high voltage lateral IGFETs for use intelligent power switch such a RESURF region may be used to provide a drain extension region enabling the lateral IGFET to withstand high reverse voltages between the source and the drain regions. Where, as in the case of the arrangement shown in FIG. 4 of the aforementioned paper, the semiconductor body in which the lateral IGFET is to be formed provides, for example, the drain of a vertical IGFET, for example a vertical power MOSFET of the intelligent power switch, and the lateral and vertical IGFETs are to be of the same conductivity type, for example n channel type, then the lateral IGFET needs to be isolated from the surrounding semiconductor body by a pn junction formed by providing the lateral IGFET in a well of the opposite conductivity type to the semiconductor body and in order to provide high voltage isolation at least part of the well may be formed as a RESURF region. The introduction of such RESURF regions does however require delicate and precise control of the diffusion process and for this reason, the RESURF regions would normally be inserted as the last stage of the diffusion process. This however requires the insulated gate structure to be provided after completion of all the diffusion processes and therefore prevents the use of the insulated gate structure as a mask for the introduction of the impurites to form the source and drain regions of the lateral IGFET, that is the so-called auto-aligned process technology cannot be used.

Because of manufacturing tolerances, the insulated gate width and therefore channel length have to be larger when such auto-aligned techniques cannot be used and therefore the on resistance of the IGFETs will be high.

SUMMARY OF THE INVENTION

According to one aspect of the present invention, there is provided a method of manufacturing a semiconductor device comprising a lateral insulated gate field effect transistor, which method comprises providing a semiconductor body having adjacent a given surface a first region of one conductivity type, introducing impurities of the opposite and the one conductivity type into the semiconductor body, heating the semiconductor body in an oxidising atmosphere to cause the introduced impurities to diffuse to define a first RESURF region of the opposite conductivity type adjacent the given surface and a second RESURF region of the one conductivity type within the first RESURF region adjacent the given surface and to grow a relatively thick layer of insulating material on the given surface overlying the first RESURF region, defining an insulated gate structure by providing a relatively thin region of insulating material on a first area of the given surface overlying the first RESURF region and providing a conductive layer extending on the relatively thin insulating layer and onto the relatively thick insulating layer and introducing impurities into the semiconductor body using the insulated gate structure as a mask to form source and drain regions aligned to the insulated gate structure with the second RESURF region providing a drain extension region aligning the drain region and the first RESURF region forming at least part of a well of the opposite conductivity type within which the source and drain regions are formed.

A method embodying the invention thus enables the RESURF regions to be introduced prior to formation of the insulated gate structure so that the insulated gate structure can be used as a mask to autoalign the source and drain regions to the insulated gate structure while still allowing precise control of both the RESURF region(s).

In a preferred embodiment the step of defining the insulated gate structure includes opening a window in the relatively thick insulating layer overlying the second RESURF region to enable introduction of the impurities to form the drain region and, prior to opening the window, introducing impurities of the opposite conductivity type using the insulated gate structure as a mask to form a subsidiary region of the well aligned to the insulated gate struture and adjoining the first RESURF region so that, after introduction of the impurities to form the source and drain regions, the source region lies within the subsidiary region and defines therewith a conduction channel area underlying the insulated gate structure to provide the connection between the source and drain regions. Thus, a method embodying the invention may be used to form a DMOS type lateral IGFET structure so that the channel length is precisely defined by the diffusion of the impurities introduced to form the subsidiary region of the well and is autoaligned to the insulated gate structure while still allowing precise allow of the RESURF regions.

The step of defining a window through the relatively thick insulating layer covering the drain extension region may comprise defining a window in the conductive material on the relatively thick insulating material layer, etching the relatively thick insulating material using the window in the conductive layer as a mask using an isotropic process to define a window in the relatively thick insulating layer and then selectively etching the conductive layer, with at least part of the upper surface of the conductive layer surrounding the window masked, to remove conductive material overhanging the edge of the window formed in the relatively thick insulating material layer. The relatively thick insulating layer may be wet-etched and then the conductive material plasma-etched to remove the conductive material overhanging the edge of the window in the relatively thick insulating material layer.

A vertical IGFET may be provided at the same time as the IGFET by introducing impurities into a further area of the given surface to provide a body region of the opposite conductivity type adjacent the given surface and a further source region of the one conductivity type within the body region and to provide a further insulated gate overlying a channel area of the further second region to provide a gateable connection between the further source region and the first region which forms the drain region of the vertical IGFET.

A method embodying the invention enables impurities for forming relatively deep, highly doped regions of the opposite conductivity type to be introduced and partially diffused prior to introducing the impurities for forming the RESURF regions without sacrificing precise control of the RESURF regions. Such a relatively deep, highly doped region may extend through the subsidiary region of the lateral IGFET and/or through the or each body region of the vertical IGFET where present.

In one embodiment, a method embodying the invention may comprise introducing the impurities to provide the relatively highly doped relatively deep region(s) using an implantation dose of approximately $5 \times 10^{14}$ atoms cm$^{-2}$, introducing the impurities to form the first relatively lowly doped relatively shallow region of the opposite conductivity type using a dose of, approximately, from $2 \times 10^{12}$ to $10 \times 10^{12}$ atoms cm$^{-2}$ and introducing the impurities to form the second relatively lowly doped relatively shallow region using an implantation dose of, approximately, from $1 \times 10^{12}$ to $5 \times 10^{12}$ atoms cm$^{-2}$. Where at least the first region comprises monocrystalline silicon, the impurity introduced to provide the ,relatively deep relatively highly doped region(s) may be boron while the impurities introduced to provide the first and second relatively lowly doped relatively shallow regions may be boron and arsenic, respectively. The heating of the semiconductor body may be carried out by heating the body first in a dry and then in a wet oxidising atmosphere.

Embodiments of the invention will now be described, by way of example, with reference to the accompanying drawings,

BRIEF DESCRIPTION OF THE DRAWINGS

FIGS. 7 to 9 are schematic cross-sectional views of part of a semiconductor body illustrating a modification of the method illustrated by FIGS. 1 to 6; and FIG. 10 is a schematic cross-sectional view, part cut-away, of a semiconductor device comprising a lateral insulated gate transistor and a vertical insulated gate transistor and manufactured using a method in accordance with the invention.

DESCRIPTION OF THE PREFERRED EMBODIMENTS

Figure 1:
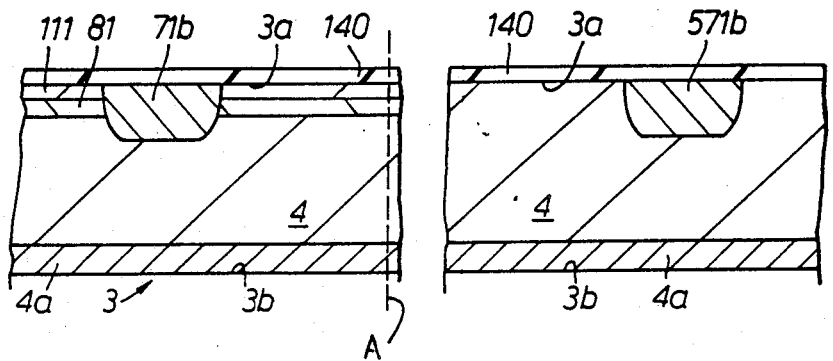
FIGS. 1 to 6 are schematic cross-sectional views, part cut-away, of a semiconductor body illustrating various steps in a first embodiment of a method in accordance with the invention for providing a high voltage lateral IGFET and a power MOSFET in a semiconductor body.

Referring now to the drawings, it should be understood that the Figures are merely schematic and are not drawn to scale. In particular certain dimensions such as the thickness of layers or regions may have been exaggerated while other dimensions may have been reduced. It should also be understood that the same reference numerals are used throughout the Figures to indicate the same or similar parts.

Referring now to FIG. 10, there is shown a semiconductor device embodying the invention in which both a lateral high-voltage insulated gate field effect transistor and a vertical insulated gate field effect transistor are provided. The lateral insulated gate field effect transistor (IGFET) 1 is shown on the left hand side of FIG. 10 while the vertical IGFET 2 is shown on the right hand side in FIG. 10. Only part of each of the IGFET 1 and IGFET 2 is shown and it should be appreciated that the IGFET 1 is symmetrical about an axis indicated by the dashed line A in FIG. 10.

The semiconductor device shown in FIG. 10 comprises a semiconductor body 3 of one conductivity type (n-type in this example where the minus sign indicates relatively low doping). The semiconductor body 3 comprises a lowly doped n-type epitaxial layer 4 on a highly doped n-type substrate 4a.

Referring now to the left hand side of FIG. 10, the lateral IGFET 1 comprises a second region 5 of the opposite conductivity type (p type in the example) which meets a given surface 3a of the semiconductor body and which, given that the structure is symmetrical about the axis A, provides a well which forms a pn junction 6 with the epitaxial layer or first region 4 so as to isolate the IGFET 1 from the epitaxial layer or first region 4 for reasons which will be explained hereinafter.

The second region 5 comprises an outer or first subsidiary region 7a which is annular when viewed in plan and defines the periphery of the well and a second or central subsidiary region 8. It should be understood that, as used herein, the term 'annular' includes, for example, annuli of circular, elliptical, rectangular or other polygonal shapes, the shape of the outer subsidiary region 7a when viewed in plan looking down onto the given surface 3a being determined by the desired geometry of the device.

The first subsidiary region 7a is a relatively shallow region 7a and a more highly doped relatively deep region 7b is disposed centrally of the relatively shallow region 7a to form with the first subsidiary region a body region 7.

The central or second subsidiary region 8 which extends between and adjoins the inner periphery 7'a of the first subsidiary region 7a is sufficiently lowly doped and sufficiently thin so that the second subsidiary region 8 becomes fully depleted of free charge carriers in operation of the IGFET 1 before a reverse-biassing voltage across the pn junction 6 reaches the breakdown voltage of the pn junction 6. The second subsidiary region 8 thus acts to spread the depletion region of the reverse-biassed pn junction 6 laterally (i.e. along the surface 3a) and so reduces the electric field at the given surface 3a, thereby increasing the breakdown voltage of the pn junction 6. Such a region is known as a RESURF (REduced SURface Field) region and is described in detail in, for example, a paper entitled 'high voltage thin layer devices (RESURF devices)' by J. A. Appels et al published in Philips Journal of Research Vol 35 No 1 1980 at pages 1 to 3. As indicated in the aforementioned paper in order to function as a RESURF region, the product Nd of the thickness (or depth) d in cm and the doping concentration N in atoms $cm^{-3}$ of the region should be approximately $2 \times 10^{12}$ atoms $cm^{-2}$.

A source region 9 of the one conductivity type (n+ type in this example where the plus sign indicates relatively high doping) is provided within and forms a pn junction 9a with the body region 5 adjacent the given surface 3a. As shown in FIG. 10, the source region 9 is offset towards the inner periphery 7'a of the relatively shallow first subsidiary region 7a and extends into the relatively deep region 7b. A drain region 10 of the one conductivity type (n+ type in this example) is similarly provided adjacent the given surface in the RESURF or central subsidiary region 8 so a to be spaced apart from the source region 9. As indicated above, the IGFET 1 is symmetrical about the axis A and therefore the source region 9 is annular and surrounds the drain region 10.

A lowly doped region 11 of the one conductivity type adjacent the given surface 3a provides an extension of the drain region 10 towards the source region 9. The lowly doped drain extension region 11 forms a further RESURF region which enables the IGFET 1 to withstand not only a high voltage between the drain region 10 and the first region 4 but also a high voltage between the source and drain regions 9 and 10. As shown in FIG. 10, the drain region 10 lies wholly within the RESURF region 11 and the RESURF region 11 forms a pn junction 11a with the RESURF region 8.

An insulated gate 12 overlies a first area 31a of the given surface 3a so that the underlying relatively shallow region 7a provides a channel area 13 which, under control of a signal applied to the insulated gate 12, provides a gateable connection between the source and drain regions 9 and 10. The insulated gate 12 comprises a relatively thin insulating layer 14 of, for example, silicon dioxide and an overlying electrically conductive gate layer 15 of, for example doped polycrystalline silicon. The conductive gate layer 15 may however be a metal layer or a metal silicide layer or a composite of two or more of the afore-mentioned layers.

As shown in FIG. 10, the conductive gate layer 15 is stepped up over a relatively thick insulating layer 14a to provide a field plate 16 which, together with the drain RESURF region 11, acts to help the IGFET withstand high voltages between the source region 9 and drain region 10 and between the drain region 10 and the first region 4.

As illustrated in FIG. 10, the outer periphery 7"a of the second region 5 may be similarly covered with a relatively thin insulating layer 14 upon which is provided the conductive gate layer 15. Again, although not shown, the conductive gate layer 15 may be stepped up over a relatively thick insulating layer to provide a field plate for the periphery of the IGFET 1.

A further insulating layer 17 of silicon dioxide extends over the conductive gate layer 15. Metallisation, for example aluminium, is provided on the given surface 3a to provide electrical contacts 18 and 19 for the source and drain regions 9 and 10 respectively and to provide, via a window (not shown) opened in the insulating layer 17, an electrical contact (not shown) to the conductive gate layer 15. Metallisation 20 may be provided on the surface 3b for subsequent packaging purposes or for reasons which will be explained hereinafter.

The doping of the channel area 13 of the lateral IGFET 1 may be controlled so as to produce either an enhancement (normally off) or a depletion (normally on) mode IGFET 1 by controlling the relative proportion of the impurities introduced to form the RESURF regions 8 and 11 and the relatively shallow region 7a received by the first area 31a of the given surface 3a.

Referring now to the right hand side of FIG. 10, only part of the power MOSFET 2 is shown and it should be appreciated that, as is known in the art, the power MOSFET 2 will consist of many hundreds of parallel-connected IGFET cells with a common drain region and that FIG. 10 shows only a small part of the power MOSFET. Each cell of the vertical power MOSFET 2 consists of an island-like body region 57 of the opposite conductivity type (p type in this example) formed within the epitaxial layer or first region 4. The body regions 57 are arranged in a regular array. Thus for example, where the body regions 57, when viewed in plan, have the geometric outline of a rectangle or square with rounded corners, the body regions 57 may be arranged in a rectangular or square matrix whereas if the body regions 57, when viewed in plan, are hexagonal in shape, then the cells may be arranged in a hexagonal close-packed array.

Each body region 57 has, as shown in FIG. 10, a relatively deep relatively highly doped region 57b and a surrounding relatively shallow region 57a. A respective source region 59 of the one conductivity type (n type in this example) is provided within each body region 57 adjacent the given surface 3a and a gate structure 512 comprising only the relatively thin insulating layer 14 and the overlying conductive gate layer 15 provides insulated gates overlying channel areas 513 of the power MOSFET 2 to provide a gateable connection between the source regions 59 and the epitaxial layer 4 and substrate 4a which form the drain region, the drain contact being provided by metallisation 20 on the surface 3b of the substrate 4a opposite the given surface 3a. The insulating layer 17 is provided to extend over the power MOSFET 2 and windows opened in the insulating layer enable the metallisation deposited to provide the source and drain contacts 18 and 19 and gate contact (not shown) of the IGFET 1 also to provide source metallisation 518 and gate metallisation (not shown) for the power MOSFET 2. The source metallisation 518 shorts the source regions 59 to the associated body regions 57 as is known in the art to avoid parasitic bipolar action.

A first embodiment of a method in accordance with the invention for manufacturing the IGFETs 1 and 2 will now be described with reference to FIGS. 1 to 6.

Referring firstly to FIG. 1, a lowly doped n-type silicon epitaxial layer 4 having a resistivity of, typically, 1 to 5 ohm cm is provided on a highly doped n-type monocrystalline silicon substrate 4a.

After cleaning to remove surface contaminants and to grow a protective layer of thermal silicon dioxide, p- type impurities are locally implanted into the semiconductor body 3 via the given surface 3a using an appropriate mask and are caused to diffuse partially into the semiconductor body 3 to provide p-type regions 71b and 571b which, after subsequent processing, will form the relatively deep regions 7b and 57b of the two IGFETs 1 and 2. In this example, the p-type impurity used is boron with an implantation energy of 45 KeV and a dose of $5 \times 10^{14}$ atoms cm$^{-2}$ and the impurities are partially driven into the semiconductor body by heating the semiconductor body to a temperature of approximately 900 degrees Celsius in an inert atmosphere.

A photosensitive resist mask is then provided on the given surface 3a and patterned using conventional photolithographic and etching techniques to protect the area of the given surface in which the vertical IGFET or power MOSFET 2 is to be formed.

P-type impurities are then locally implanted into the semiconductor body via the given surface 3a using an appropriate mask and subsequently n-type impurities are implanted through an appropriate subsequent mask to form regions 81 and 111 respectively which, after subsequent processing, will provide the central RESURF region 8 and the drain extension RESURF region 11 of the lateral IGFET 1. In this example the p-type impurity used is boron with an implantation energy of 170 KeV and a dose of from $2 \times 10^{12}$ to $10 \times 10^{12}$ atoms cm$^{-2}$ whilst the n-type impurity is arsenic with an implantation energy of 170 KeV and a dose of from $1 \times 10^{12}$ to $5 \times 10^{12}$ atoms cm$^{-2}$.

The photoresist mask is now removed and the introduced impurities are then caused to diffuse into the semiconductor body by heating the semiconductor body. The heating is carried out in an oxidising atmosphere so that, simultaneously with the diffusion, a relatively thick layer 140 of silicon dioxide is grown on the area of the given surface 3a. In this particular example, the semiconductor body is heated to 1100 degrees Celsius in an oxidising atmosphere for 255 minutes to produce a relatively thick layer of field oxide layer of approximately 0.8 micrometers (8000 Angstroms) thickness. The heat treatment in the oxidising atmosphere may comprise a first heating step in a dry oxygen atmosphere and a subsequent wet oxidising step in a wet oxygen atmosphere.

The relative duration of the dry and wet oxidising steps so not significantly affect the drive in of the impurities to form the relatively deep region 7b and, by adjusting the dose of impurities introduced to produce the RESURF regions 8 and 11 and the relative durations of the wet and dry oxidation steps, the desired thickness of relatively thick or field oxide can be grown without detrimentally affecting the desired profile for the RESURF regions 8 and 11. For example, for a boron dose of $8 \times 10^{12}$ atoms cm$^{-2}$ and an arsenic dose of $3 \times 10^{12}$ atoms cm$^{-2}$, the dry oxidising step may last say 140 minutes and the wet oxidising step 105 minutes.

Figure 2:
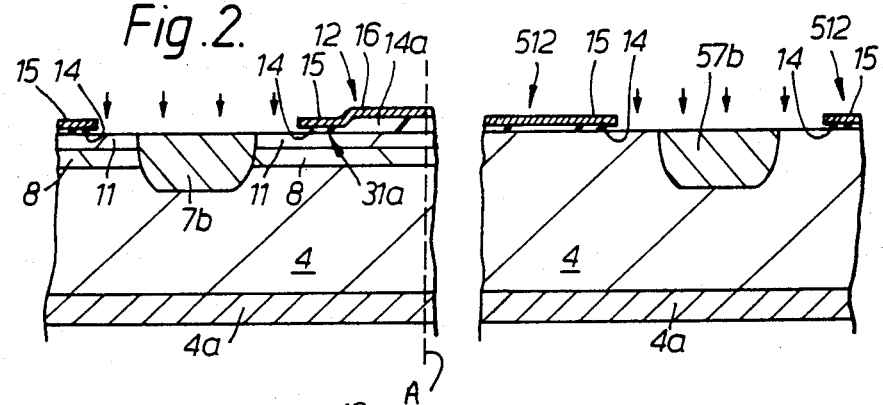
Figure 3:
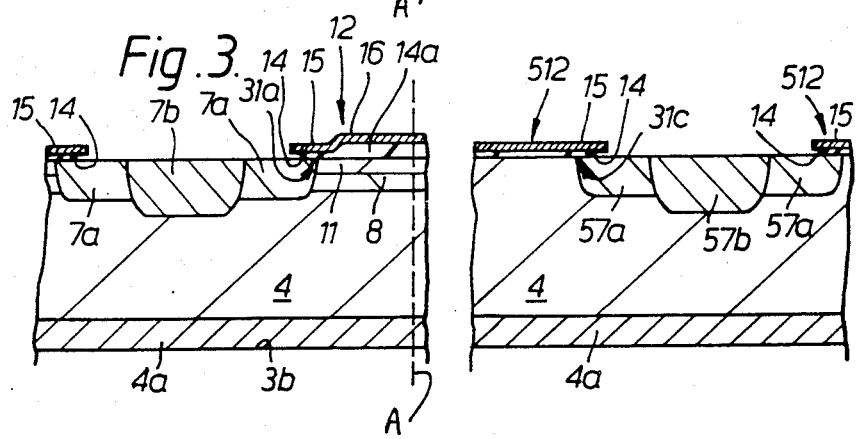

Referring now to FIG. 2, the field oxide or relatively thick insulating layer is then patterned or defined using a conventional photolithographic and etching technique to define the relatively thick insulating layer 14a of the IGFET 1. A relatively thin insulating layer of gate oxide is grown on the given surface 3a. Polycrystalline silicon is then deposited on the insulating layer 14,14a providing the conductive layer 15,16 and the polycrystalline silicon layer then patterned or defined using conventional photolithographic and etching technique to provide the insulated gate structure 12 of the IGFET 1 and the insulated gate structure 512 of the power MOSFET 2.

Figure 4:
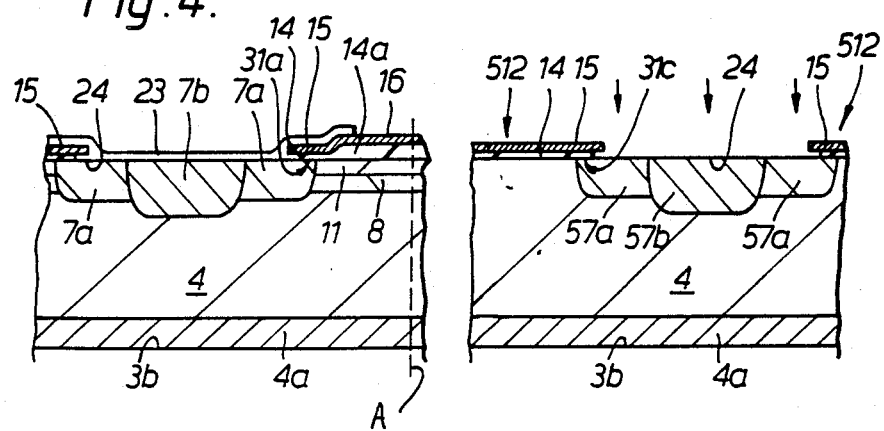

Using the insulated gate structures 12 and 512 as a mask, p-type impurities, in this example boron, are implanted into the semiconductor body 3 to provide the relatively shallow regions 7a and 57a of the IGFET 1 and the power MOSFET 2. The implantation of the p-type impurities may be carried out in two stages where it is desired for the lateral IGFET to be a depletion mode IGFET. Thus, in the first stage impurities are implanted using only the insulated gate structures 12 and 512 as a mask so that impurities are introduced to form the relatively shallow regions 7a and 57a of both IGFETs. Then, as illustrated in FIG. 4, an appropriate mask 23 is provided over an exposed area 24 of the body region 7 of the lateral IGFET 1 to protect it against further implantations. For example, the exposed area 24 may be protected by a relatively thick deposited oxide layer. A second dose of p-type impurities is then, as indicated in FIG. 4, directed at the given surface 3a so as to increase the concentration of p-type impurities within the first subsidiary regions 57a of only the vertical power MOSFET 1. The first and second doses of p-type impurities are selected such that the first dose alone is not sufficient to cause the channel areas 13 and 513 of the lateral IGFET and the power MOSFET 2 to become predominantly p-type but the combination of the two doses is sufficient. Thus, as the channel areas 513 of the power MOSFET are exposed during both the first and the second implantation steps, p-type channel areas 513 will be provided whereas because the channel area 13 is protected against the second implantation step by the mask 23, an n-type channel area 13 will be provided adjacent the first area 31a. The IGFET 1 may thus be formed as a depletion mode IGFET and this is illustrated in the figures by showing the n type channel area 13 with a solid line and the p type channel area 513 with a dashed line. In this particular example the first and second implantation steps may both be of boron with an implantation energy of 180 KeV and a dose of $5 \times 10^{12}$ atoms cm$^2$.

Of course, if it is desired that the lateral IGFET 1 be an enhancement mode type IGFET then the mask 23 is not required and a single appropriate dose of p-type impurities can be used to make the channel area 13 as well as the channel areas 513 predominantly p-type. Similarly, the method could be used to form a depletion mode lateral IGFET and an enhancement mode lateral IGFET at the same time as the power MOSFET 2 with appropriate mask modification, the channel area of the depletion mode lateral IGFET being masked during the second implantation step.

Using such a method enables the characteristics of the RESURF regions 8 and 11 to be optimised as well as the enhancement and depletion characteristics. Morever, since neither of the two p-type implantation steps is critical in alignment (both being self-aligned to the insulated gate structure), the method is relatively simple and should not affect alignment tolerances during manufacture.

Figure 5:
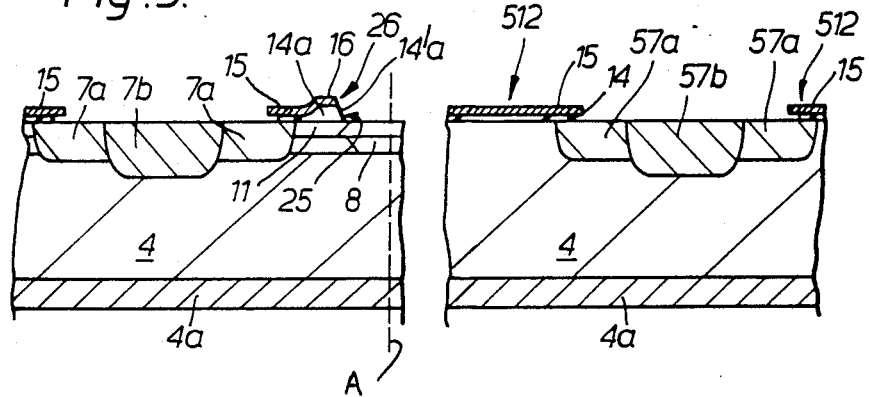
Figure 6:
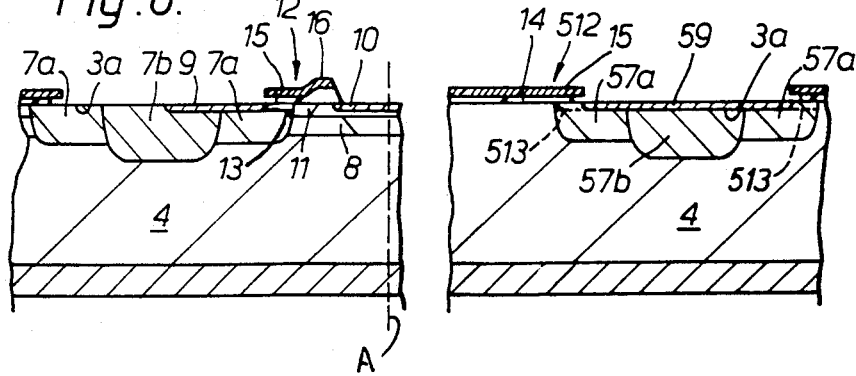

After removal of the mask 23, if present, it is necessary to open a window 25 in the relatively thick insulating layer 14a to enable introduction of the impurities to produce the drain region 10 of the lateral IGFET 1. As shown in FIG. 5, this may be achieved by having first opened a window 26 in the polycrystalline silicon layer 15,16 during the defining of the insulated gate structure 12 of the lateral IGFET 1, using a reactive ion etching technique to etch the window 25 through the relatively thick insulating layer 14a as shown in FIG. 5.

Having opened the window 25, n-type impurities, in this example arsenic with an implantation energy of 80 keV and a dose of $4 \times 10^{15}$ atoms cm$^{-2}$, are implanted into the given surface using the insulated gate structures 12 and 512 as a mask to produce the source and drain regions 9 and 10 of the IGFET 1 and the source regions 59 of the power MOSFET 2 aligned to their respective gate structures 12 and 512.

The further insulating layer 17, in this example of silicon dioxide, is then deposited onto the given surface 3a. Windows are then opened in the insulating layer 17 and metallisation, for example aluminium, deposited (FIG. 10) to form the source and drain contacts 18 and 19 and the gate contact (not shown) of the lateral IGFET and the source contact or metallisation 518 of the power MOSFET 50. As mentioned above, each source region 59 of the power MOSFET should be shorted to the associated body region 57 to avoid parasitic bipolar action and this may be done before depositing the metallisation by, for example, masking a central portion of the areas of the surface 3a where the source regions 59 are to be provided during implantation of the impurities to form the source regions 9 and 59 and the drain region 10 so that a central portion of each body region 57 extends to the given surface or as, illustrated in FIG. 10, by etching away a central portion of the source regions 59 using an appropriate photolithographic and etching technique to expose the central portion of the body regions 57. The source contact metallisation of the lateral IGFET extends outwardly over the insulating layer 17 beyond the outer periphery of the body region 7 to provide a field plate 18a. The gate polycrystalline silicon layer 15,16 may similarly extend outwardly beyond the outer periphery 7"a up onto relatively thick insulating material (not shown) to provide a double field plate structure. 10 As indicated above, the power MOSFET 2 consists of an array or matrix of many hundreds of IGFET cells connected in parallel and having a common drain region. To provide field relief for the cells at the periphery of the array, a field plate structure may be provided. FIG. 10 illustrates part of such a field plate structure. As shown in FIG. 10, the conductive gate layer 15 at the periphery of the power MOSFET 2 extends up onto a relatively thick region 14a of the insulating layer to provide a field plate 16. The source metallisation 518 similarly extends over the insulating layer 17 outwardly from the periphery to provide a field plate 518a. Of course, any suitable form of high voltage edge termination may be used. Thus, for example one or more floating or Kao's rings may be provided in addition to or in place of the field plating structure.

Although the use of the reactive ion etching technique described above with reference to FIG. 5 provides a good edge 14'a in the relatively thick insulating layer 14a enabling the drain region 10 to be self-aligned to the window 26 in the polycrystalline silicon layer 15, 16 and subsequent good coverage by the further insulating layer 17 and the metallisation for the drain contact 19, reactive ion etching techniques are both time-consuming and very expensive and are therefore not particularly suited to mass production. From the point of view of mass production, a wet etching technique is to be preferred. However, such a technique has problems, in particular, the isotropic wet etching of the relatively thick insulating layer 14a through the window 26 results in back or under etching leaving a polycrystalline silicon overhang. Such an overhang is highly undesirable as it means that the subsequent insulating layer may virtually double back upon itself to follow round the overhang which not only may cause voids in the insulating layer but means that the subsequent aluminium is deposited onto a surface having sharp bends (following the polycrystalline silicon overhang) at which breaks in the aluminium track may occur. The present inventors however have developed a wet etching process which avoids such problems and which may therefore be used as an alternative to the anisotropic reactive ion etching process mentioned above.

The modified method of etching the window 25 through the relatively thick insulating layer 14a is illustrated in FIGS. 7 to 9.

Thus, as shown in FIG. 7, the window 26 is first opened in the polycrystalline silicon layer 15, 16 using a photosensitive resist mask and a selective polycrystalline silicon etching process such as a plasma etching process. The plasma etching may be, for example, carried out using a CF$_4$ (carbon tetrafluoride) plasma containing 8% oxygen and at 400 Torr ($5.3 \times 10^4$ Pa) in a barrel type reactor. The window 26 will normally be opened during the definition of the conductive layer 15,16 to provide the insulated gates 12 and 512, the relatively thick insulating layer 14a protecting the underlying silicon from the subsequent implantation step to form the first subsidiary regions 7a and 57a. A mask 27 is then provided on the polycrystalline silicon layer. As the mask 27 is required mainly to protect the insulated gate structure 12, alignment of the mask 27 to the window 26 is not required and as indicated the opening in the mask 27 may be considerably larger than the window 26. The insulating material 14a is then wet etched, using for example buffered HF, through the window 26 to a desired depth which leaves a thin layer 28, for example 1000 Angstroms, of insulating material covering the surface 3a within the window 26 to protect the surface 3a.

As indicated in FIG. 7, the wet etching causes under or back etching of the relatively thick insulating layer 14a thereby leaving an overhang 29 of polycrystalline silicon which if left in place would, as indicated above, result in both the subsequent insulating layer 17 and metallisation 19 having to be provided on a very stepped surface which sharply doubles back on itself under the overhang.

What is of importance is that the subsequent drain region is aligned to the edge of the window in the polycrystalline silicon layer to facilitate preservation of the integrity of the RESURF region 11. Accordingly after the insulating material 14a has been wet-etched as described above, the polycrystalline silicon overhang 29 can be removed using a selective etching process such as a plasma etching process even though this may result in a reduction of the thickness of the polycrystalline silicon layer so that the layer tapers towards the edge 16a of the window 26 and even though the final dimensions of the window 26 will not be precisely controlled. The plasma etching may be carried out at 400 Torr ($5.3 \times 10^4$ Pa) in a conventional barrel type reactor using a CF$_4$ plasma containing about 8% oxygen. A final short wet etching step may then be performed to remove the thin insulating layer 28 which protected the surface 3a within the window 25 during the plasma etching and also to smooth out the edge 14'a of the window 25.

The above described method thus enables a window to be opened in the relatively thick insulating layer 14a using a process which is relatively cheap and quick without the problem which would have arisen if a conventional simple wet etching technique had been used. Typically, such a method may comprise, where the relatively thick insulating layer is approximately 8000 Angstroms thick, an approximately 16 minute wet etch to open the window 26, a subsequent plasma etch for approximately three minutes to remove the overhang 29 and a final short, approximately twenty second, wet etch to remove the insulating layer 28.

As a modification of the method described, with reference to FIGS. 7 to 9, the window 26 may be opened after introduction of the impurities to form the first subsidiary regions 7a and 57a, a photosensitive resist mask being used with a plasma etching technique to define the window 26 in the polycrystalline silicon layer. The insulating material layer 14a may then be wet etched with the photosensitive resist mask still in place and the plasma etching process finally used again to remove the polycrystalline silicon overhang 29. Such a method may have advantages in that because the upper surface of the polycrystalline silicon layer remains protected by the photoresist mask thinning of the polycrystalline silicon layer 15,16 around the window 26 during removal of the overhang 29 may be reduced as the surface of the polycrystalline layer 15,16 is protected by the photoresist mask. In a typical process, the plasma etch through the photoresist mask may have a duration of approximately 8.5 minutes, the subsequent wet etching step a duration of approximately 16 minutes and the final plasma etch a duration of approximately three minutes.

One or more further semiconductor components may be manufactured in or on the semiconductor body with the lateral and vertical IGFETs. Thus, as mentioned above, both enhancement and depletion type IGFETs may be provided as may one or more low voltage logic type semiconductor components enabling the production of a so-called intelligent power switch, that is a semiconductor device in which logic circuitry for controlling operation of a high power semiconductor device is incorporated in or on the same semiconductor body for use in controlling power supply to lights, electric motors etc. under the control of logic signals from a central control circuit. For example a simple bus system and such intelligent power switches may be used to replace the traditional loom used for distributing power in motor vehicles.

Although the edges of the conductive gate layers 15,16 have been illustrated as being straight, the edges especially of any power MOSFET gate layer may be bevelled or tapered using a technique such as that described in Siemens Forschungs and Entwicklungs Berichte .Bd 9(1980) Nr 4 at page 192.

The geometry of the various regions when viewed in plan may be circular, square (or rectangular) with rounded corners or hexagonal or any other suitable shape but for convenience all the regions should have the same geometry. Thus, for example, if a power MOSFET having a checkerboard type pattern of square cells (i.e. square outline body and source regions) is desired then the IGFET regions should have a similar outline or geometry with the first subsidiary region 7b and the source region 9 having a square frame shape.

The method described above of introducing the relatively deep regions 57b or 7b has particular advantages in that it enables the RESURF regions 8 and 11 which require delicate control to be introduced near the beginning of the manufacturing process rather than as is normal as the last diffusion step. This is particularly advantageous in that it enables self-alignment of the source and relatively shallow first subsidiary regions 9 and 7a (and 59 and 57a if present) to the insulated gate structure 12 (and the insulated gate structure 512 if present) resulting in a precisely defined and hence short channel length.

The conductivity types of the various regions mentioned above could of course be reversed and the semiconductor body may comprise a semiconductor other than silicon. Furthermore, the power semiconductor switch could be any type of MOS-gated power device.

From reading the present disclosure, other modifications will be apparent to persons skilled in the art. Such modifications may involve other features which are already known in the design and manufacture of semiconductor devices and which may be used instead of or in addition to features already described herein. Although claims have been formulated in this application to particular combinations of features, it should be understood that the scope of the disclosure of the present application also includes any novel feature or any novel combination of features disclosed herein either explictly or implicitly or any generalisation or modification of one or more of those features, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. A method of manufacturing a semiconductor device comprising a lateral insulated gate field effect transistor, which method comprises providing a semiconductor body having adjacent a given surface a first region of one conductivity type, first introducing impurities of the opposite conductivity type and then introducing impurities of the one conductivity type into the semiconductor body, heating the semiconductor body in an oxidising atmosphere to cause the introduced impurities to diffuse to define a first RESURF region of the opposite conductivity type adjacent the given surface and a second RESURF region of the one conductivity type within the first RESURF region adjacent the given surface and to grow a relatively thick layer of insulating material on the given surface overlying the first RESURF region, defining an insulated gate structure by providing a relatively thin region of insulating material on a first area of the given surface overlying the first RESURF region and providing a conductive layer extending on the relatively thin insulating layer and onto the relatively thick insulating layer and introducing impurities into the semiconductor body using the insulated gate structure as a mask to form source and drain regions aligned to the insulated gate structure with the second RESURF region providing a drain extension region aligning the drain region and the first RESURF region forming at least part of a well of the opposite conductivity type within which the source and drain regions are formed.

2. A method according to claim 1, wherein the step of defining the insulated gate structure includes opening a window in the relatively thick insulating layer overlying the second RESURF region to enable introduction of the impurities to form the drain region and wherein, prior to opening the window, impurities of the opposite conductivity type are introduced using the insulated gate structure as a mask to form a subsidiary region of the well aligned to the insulated gate structure and adjoining the first RESURF region so that, after introduction of the impurities to form the source and drain regions, the source region lies within the subsidiary region and defines therewith a conduction channel area underlying the insulated gate structure to provide a connection between the source and drain regions.

3. A method according to claim 2, wherein the step of defining a window through the relatively thick insulating layer covering the drain extension region comprises defining a window in the conductive material on the relatively thick insulating material layer, etching the relatively thick insulating material using the window in the conductive layer as a mask using an isotropic process to define a window in the relatively thick insulating layer and then selectively etching the conductive layer with at least part of the upper surface of the conductive layer surrounding the window masked to remove conductive material overhanging the edge of the window formed in the relatively thick insulating material layer.

4. A method according to claim 3, which comprises wet etching the relatively thick insulating material to define the window in the relatively thick insulating material layer and then plasma etching the conductive material to remove the conductive material overhanging the edge of the window in the relatively thick insulating material layer.

5. A method according to claims 1, 2, 3, or 4 which comprises providing a vertical insulated gate field effect transistor at the same time as the lateral IGFET by introducing impurities into a further area of the given surface to provide a body region of the opposite conductivity type adjacent the given surface and a further source region of the one conductivity type within the body region and to provide a further insulated gate overlying a channel area of the body region to provide a connection between the further source region and the first region which forms the drain region of the vertical IGFET.

6. A method according to claim 5, which comprises introducing into the first region impurities for forming a relatively highly doped relatively deep region of the opposite conductivity type for the vertical IGFET and causing partial diffusion of the introduced impurities into the semiconductor body prior to introducing the impurities for forming the first and second RESURF regions so that the heating in the oxidising atmosphere also defines, for the vertical IGFET, the relatively deep relatively highly doped region which after formation of the source and drain regions extends through but is laterally surrounded by the body region of the vertical IGFET.

7. A method according to claims 1, 2, 3, or 4 which comprises introducing into the first region impurities for forming a relatively highly doped relatively deep region of the opposite conductivity type for the lateral IGFET and causing partial diffusion of the introduced impurities into the semiconductor body prior to introducing the impurities for forming the first and second RESURF regions so that the heating in the oxidising atmosphere also defines, for the lateral IGFET, the relatively deep relatively highly doped region which after formation of the source and drain regions extends through but is laterally surrounded by the subsidiary region of the well of the lateral IGFET.

8. A method according to claims 1, 2, 3, or 4 which comprises carrying out the step of heating the semiconductor body by heating the body first in a dry oxygen atmosphere and then in a wet oxygen atmosphere.

* * * * *